US005641706A

United States Patent [19]

Tjaden et al.

[11] Patent Number: 5,641,706
[45] Date of Patent: Jun. 24, 1997

[54] METHOD FOR FORMATION OF A SELF-ALIGNED N-WELL FOR ISOLATED FIELD EMISSION DEVICES

[75] Inventors: Kevin Tjaden, Boise; John K. Lee, Meridian, both of Id.

[73] Assignee: Micron Display Technology, Inc., Boise, Id.

[21] Appl. No.: 599,440

[22] Filed: Jan. 18, 1996

[51] Int. Cl.$^{6}$ .................... H01L 21/22

[52] U.S. Cl. .................... 438/20; 438/524; 438/555

[58] Field of Search .................... 437/38, 156, 157, 437/228 TI, 916, 984

[56] References Cited

U.S. PATENT DOCUMENTS

| | | | |
|---|---|---|---|
| 3,970,887 | 7/1976 | Smith et al. | 313/309 |
| 4,370,797 | 2/1983 | van Gorkom et al. | 437/916 |
| 5,049,520 | 9/1991 | Cathey | 437/60 |
| 5,186,670 | 2/1993 | Doan et al. | 445/24 |
| 5,210,472 | 5/1993 | Casper et al. | 315/349 |
| 5,212,426 | 5/1993 | Kane | 315/169.1 |
| 5,229,331 | 7/1993 | Doan et al. | 437/228 |
| 5,259,799 | 11/1993 | Doan et al. | 445/24 |
| 5,302,238 | 4/1994 | Roe et al. | 156/643 |
| 5,302,239 | 4/1994 | Roe et al. | 156/643 |
| 5,329,207 | 7/1994 | Cathey et al. | 315/169.1 |
| 5,358,908 | 10/1994 | Reinberg et al. | 437/228 |
| 5,374,868 | 12/1994 | Tjaden et al. | 313/310 |
| 5,391,259 | 2/1995 | Cathey et al. | 156/643 |
| 5,420,054 | 5/1995 | Choi et al. | 437/38 |

*Primary Examiner*—Chandra Chaudhari
*Attorney, Agent, or Firm*—Hale and Dorr LLP

[57] ABSTRACT

A method for use in manufacture of field emitter devices is provided specifically for forming electron emitter tips in a doped semiconductor substrate. The method comprises the following steps: forming a depression around an emitter area in the substrate; doping the substrate in the depression; and expanding the dopant in the depression into the emitter area.

11 Claims, 3 Drawing Sheets

METHOD FOR FORMATION OF A SELF-ALIGNED N-WELL FOR ISOLATED FIELD EMISSION DEVICES

BACKGROUND OF THE INVENTION

This invention relates to the field of field emission devices, or "FED's."

FED's are used in the manufacture of flat panel displays Pat. No. 3,970,887, incorporated herein by reference, an emitter tip and a gate formed on a substrate. A voltage potential between the emitter (which comprises a cathode) and an anode located in the area of a phosphor (not shown), generates an electron stream from the emitter which causes the phosphor to emit light. Pixels of the display comprise multiple emitter tips which are controlled by gates (designated in FIG. 1G of the '887).

One acceptable way to interconnect the pixels of the display is to form the pixels on rows of N-doped silicon, as seen in FIG. 6 of the '887 patent. Subsequent processing lays transverse strips of metal to serve as the gate, as seen in FIG. 7 and FIG. 8 of the '887 patent. Other examples of interconnection of pixels are seen in U.S. Pat. Nos. 5,374,868 and 5,212,426, both of which are incorporated herein by reference.

One problem in the manufacture of these devices, however, is the need for specific masking steps to make the N-well—steps separate from those needed to form other parts of the device. Further, traditional N-well's in such devices are not "self-aligned" with the other components of the device, thus creating alignment error and limiting the reduction in pixel size needed to achieve high resolution displays. Further still, non-self-aligned processes are complex and costly.

Therefore, it is an object of the present invention to address these problems.

SUMMARY OF THE INVENTION

According to one aspect of the present invention, the above disadvantages are addressed by a method of forming electron emitter tips in a doped semiconductor substrate. The method comprises the following steps: forming a depression around an emitter area in the substrate; doping the substrate in the depression; and expanding the dopant in the depression into the emitter area, whereby conducting layers which are electrically isolated from the substrate are formed.

DESCRIPTION OF THE DRAWINGS

For a more complete understanding of the present invention and for further advantages thereof, reference is made to the following Detailed Description taken in conjunction with the accompanying drawings, in which.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
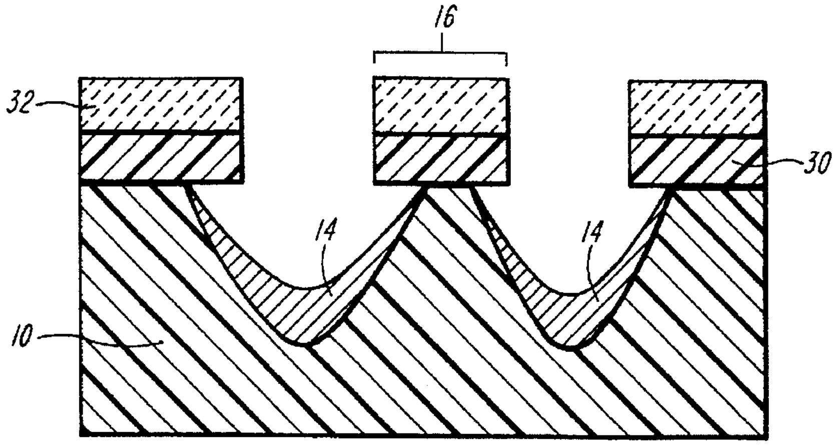
FIG. 1 is a side view of an example embodiment of the present invention.

Referring now to FIG. 1, a semiconductor substrate (10) is shown, from which an emitter tip is to be formed. An acceptable example of such a substrate is formed on a macrograin polysilicon substrate as in, for example, U.S. Pat. No. 5,329,207, incorporated herein by reference. According to the FIG. 1 embodiment, the semiconductor substrate comprises single crystalline silicon, but other semiconductor materials (for example, GaAs, macropoly, etc.) will occur to those of skill in the art that are useful according to the present invention and do not depart from its scope.

According to this embodiment, a depression (12) is formed in the P- substrate, around an emitter area (16) and the substrate in the depression is doped, to form electrically isolated region (14). According to one embodiment, the dopant comprises an N-type dopant, although a P-type dopant is also useful, according to an alternative embodiment.

Figure 2:
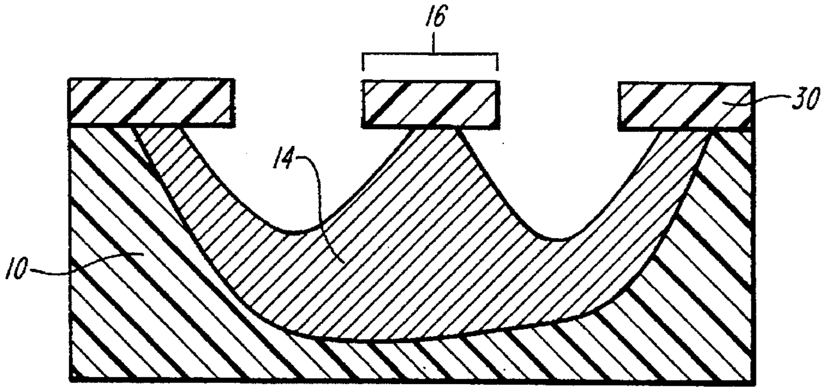
FIG. 2 is a side view of an example embodiment of the present invention.

Next, as seen in FIG. 2, the dopant region (14) is expanded. According to the embodiment shown, the emitter tip is only partially etched in the formation of the depression, and the remainder of the etching of the emitter tip is done after the doping and the expansion of the doped region (14). According to an alternative embodiment (not shown), the emitter is fully etched and sharpened, the doping is performed, and the dopant is then expanded.

Acceptable methods of forming sharp emitters are seen in U.S. Pat. Nos. 5,358,908; 5,302,238; and 5,302,239; all incorporated herein by reference.

Figure 3:
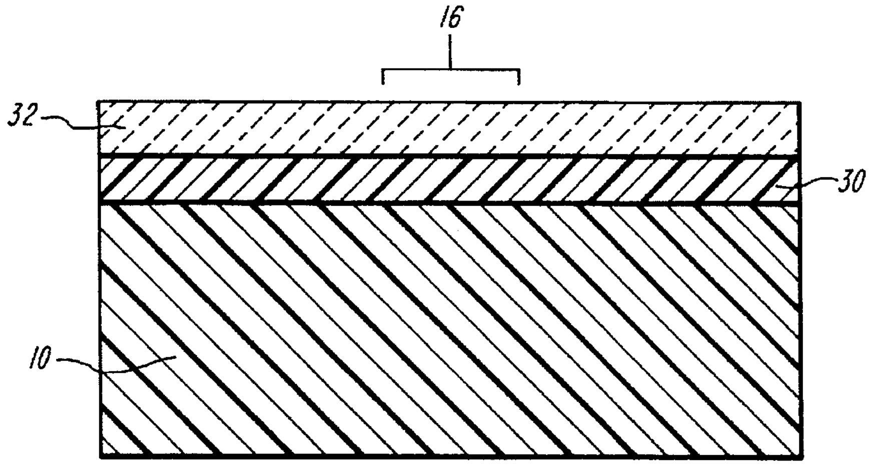
FIG. 3 is a side view of an example of a further embodiment of the present invention.
Figure 3A:
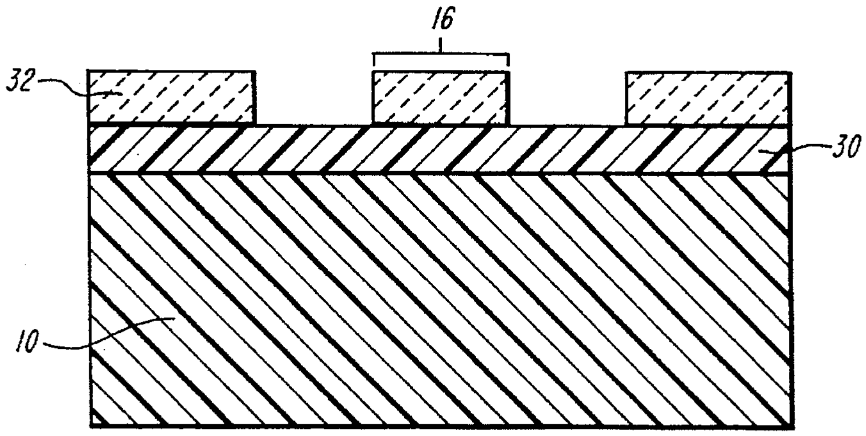
FIG. 3A is a side view of an example of still a further embodiment of the present invention.

Referring now to FIG. 3, an embodiment is shown in which the forming of the depression comprises: applying an insulator (30) to the substrate (10); applying photoresist (32) to the insulator (30); fixing the photoresist (32) over the emitter area (16); and developing the photoresist (32), wherein the insulator (30) around the emitter area (16) is exposed and fixed photoresist (32) remains (FIG. 3A). One acceptable insulator is silicon dioxide. Acceptable methods of applying the photoresist, fixing the photoresist, and developing the photoresist are known to those of skill in the art, as is the choice of photoresist.

It should also be noted that, in order to make the emitter tip conical, a heating of the photoresist in the emitter area (16) is useful in some embodiments, in order to cause the photoresist dot to flow into a circular shape.

Figure 4:
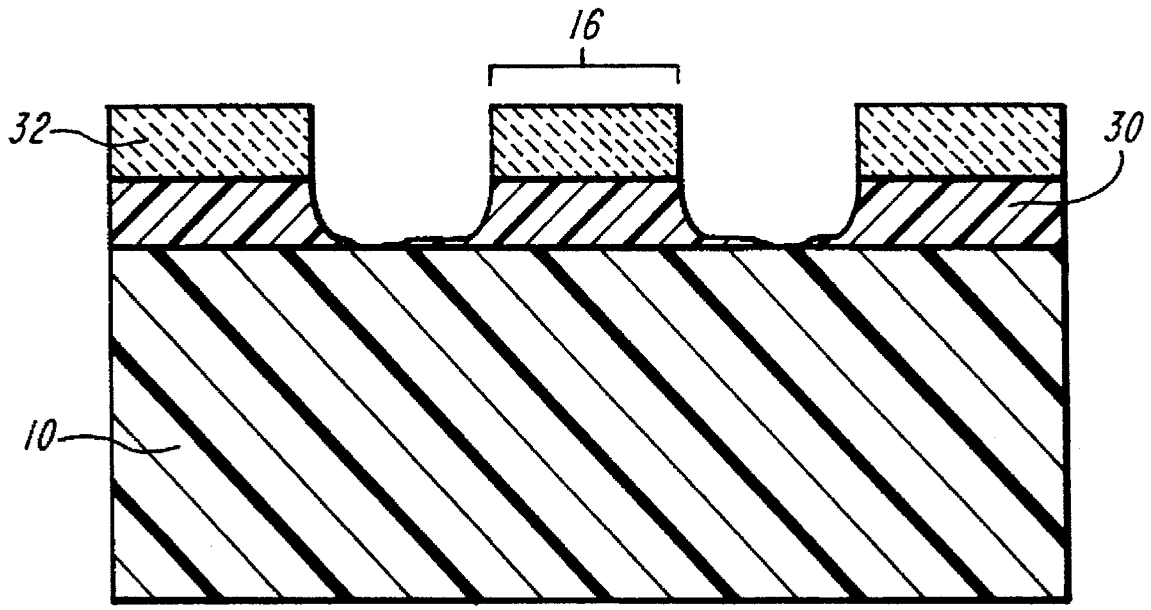
FIG. 4 is a side view of an example of another embodiment of the present invention.

Referring now to FIG. 4, a portion of the insulator (30) is then removed, along with the removing the fixed photoresist (32), wherein the insulator (30) around the emitter area (16) is exposed.

Referring again to FIG. 1, a depression area (12) is etched around the emitter area (16). Various acceptable etches will occur to those of skill in the art. Some particular etches have been tested and found to be particularly useful, as follows: plasma dry etch, by adjusting isotropic and anisotropic etch characteristics upon the emitter shape requirements (for example, emitter height to base aspect ratio). A specific etch that is useful comprises Fluorine containing gas ($SF_6$) with $Cl_2$ and He. Also useful is a combination of $SF_6$ and HBr in a two step etch (for example, see U.S. Pat. Nos. 5,302,239 and 5,302,238, issued to Roe, et al., and incorporated herein by reference).

Figure 1A:
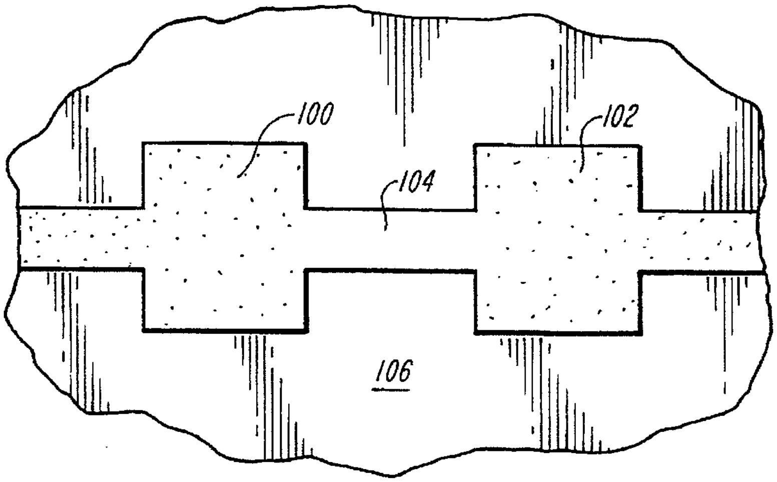
FIG. 1A is a top view of a substrate according to an embodiment of the invention.

Referring still to FIG. 1, depression area (12) is then doped to form doped region (14). Various acceptable doping methods will occur to those of skill in the art. One method that has been tested and found useful comprises ion implantation of N-type ions (for example, phosphorous with an angle tilted implant to cover a portion of the side-wall implantation). Also, in a further embodiment of the invention, the depression area and doped regions may be extended to connect cites of emitters. This situation is illustrated in FIG. 1A which shows a pair of emitter cites 100, 102 which are joined by an extended doped region 104. This embodiment allows row or column lines to be created on the substrate 106.

Another acceptable method of doping, according to another embodiment, comprises chemical vapor deposition. One specific embodiment of an acceptable chemical vapor deposition that has been tested comprises: solid source vapor phase CVD.

Another doping method believed to be useful according to still other embodiments includes: plasma immersion doping.

It will be recognized that P-type doping is also acceptable, according to still alternative embodiments of the invention, although none has been tested, and the electrical isolation is different.

Referring again to FIG. 2, after the doping, the doped area (14) is expanded by, for example, thermal diffusion. According to one embodiment, the expansion is conducted before further oxidation and etching that sharpens the emitter tip, explained in more detail below. According to an alternative embodiment, the expansion is conducted after the sharpening. According to still a further embodiment, the expansion occurs as a natural result of further processing.

According to a more specific embodiment of the invention, in order to sharpen the emitter tip, an additional insulator is applied to the emitter area (16) and the depression area (12). An acceptable example of the additional insulator is silicon dioxide, formed by an oxidation step after the implantation of the N-type dopant. A conductor is applied over the additional insulator. According to this example, a gap is formed in the conductor over at least a portion of the emitter area, during the applying of the gate conductor. One acceptable method for forming the gap is by coating only areas of the insulator having a slope less than the critical slope for conductor application to the insulator. This critical slope is understood by those of skill in the art and is achieved in a number of manners known to those of skill in the art. Acceptable examples are seen in, for example, U.S. Pat. No. 3,970,887, issued to Smith, et al. and incorporated herein by reference. Other methods actually tested are: conformal deposition of the gate conductor followed by a chemical-mechanical process (CMP). Still other methods believed to be acceptable include a conformal deposition of the gate conductor followed by an etch back planarization.

As explained in U.S. Pat. No. 3,970,887, the additional insulator is removed at a rate faster than the removal of the conductor or the semiconductor substrate. Ideally, none of conductor or semiconductor substrate is removed. One acceptable process for such removal comprises selectively etching the additional insulator using a selective etchant. Examples of etchants tested and known to be acceptable include buffered hydrofluoric acid.

Figure 2A:
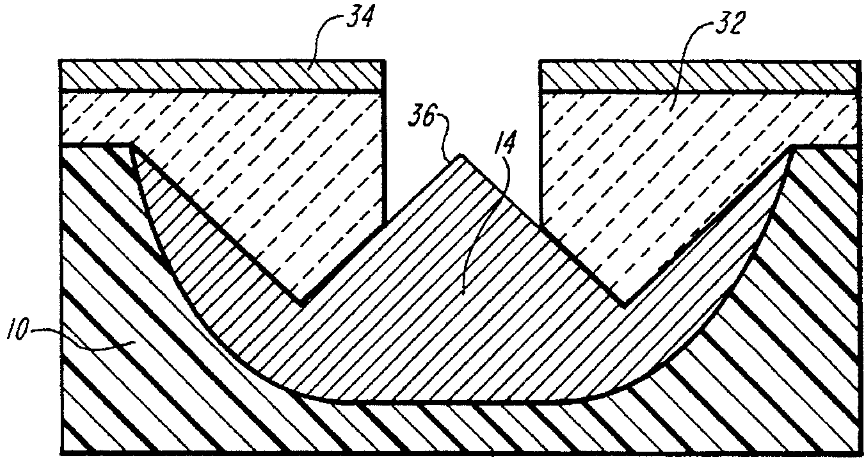
FIG. 2A is a side view of an example embodiment of the present invention.

An example embodiment of the end result of the process is seen in FIG. 2A, in which a novel active matrix cathode member is seen comprising: an addressable grid (34); an emitter (36) formed in a substrate (10) and surrounded by the grid (34) and by a a depressed, doped emitter address region (14).

The above embodiments are given by way of example only. Modifications as variations on the above will occur to those of skill in the art that do not depart from the spirit of the present invention. It is to be understood that changes may be made to them that, nevertheless, are within the scope of the invention.

What is claimed is:

1. A method of forming electron emitter tips in a doped semiconductor substrate, the method comprising:

forming a depression around an emitter area in the substrate:

doping the substrate in the depression; and expanding the dopant in the depression into the emitter area.

2. A method as in claim 1 wherein the forming comprises:

applying an insulator to the substrate;

applying photoresist to the insulator;

fixing the photoresist over the emitter area;

developing the photoresist wherein the insulator around the emitter area is exposed and the fixed photoresist remains;

removing at least a portion of the insulator;

removing the fixed photoresist, wherein the insulator over the emitter area is exposed and has a thickness greater than any insulator remaining around the emitter area;

etching a depression area around the emitter area and the emitter area.

3. A method as in claim 1 wherein the doping comprises ion implantation.

4. A method as in claim 3 wherein the ion implantation comprises implantation of N-type ion.

5. A method as in claim 1 wherein the doping comprises chemical vapor deposition.

6. A method as in claim 1 wherein the doping comprises N-type doping.

7. A method as in claim 1 wherein the doping comprises plasma immersion.

8. A method as in claim 1 wherein the expanding comprises heating the depression area.

9. A method as in claim 8 wherein the heating occurs over subsequent processing steps without a separate heating step.

10. A method as in claim 2 further comprising etching the insulator from the emitter area, wherein the emitter tip is exposed.

11. A method as in claim 2 wherein the applying an insulator comprises oxidation, wherein an oxidized layer is formed.

* * * * *